US007288450B1

United States Patent
Tailliet

(10) Patent No.: US 7,288,450 B1
(45) Date of Patent: Oct. 30, 2007

(54) GENERAL PROTECTION OF AN INTEGRATED CIRCUIT AGAINST PERMANT OVERLOADS AND ELECTROSTATIC DISCHARGES

(75) Inventor: Francois Tailliet, Fuveau (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/790,504

(22) Filed: Nov. 30, 1999

Related U.S. Application Data

(60) Continuation of application No. 08/488,131, filed on Jun. 6, 1995, now abandoned, which is a division of application No. 07/999,527, filed on Dec. 29, 1992, now Pat. No. 5,438,213.

(30) Foreign Application Priority Data

Dec. 31, 1991 (JP) ..................... 3-16411

(51) Int. Cl.
*H01L 21/8238* (2006.01)
(52) U.S. Cl. .................. 438/210; 438/200; 438/202; 438/205; 438/309; 361/100; 257/122; 257/173; 257/358; 257/379; 257/E21.001
(58) Field of Classification Search .................... None
See application file for complete search history.

(56) References Cited

U.S. PATENT DOCUMENTS

| 4,922,371 | A | * | 5/1990 | Gray et al. ................... 361/56 |
| 4,939,616 | A | * | 7/1990 | Rountree ...................... 361/56 |
| 5,272,371 | A | | 12/1993 | Bishop et al. .............. 257/362 |
| 5,465,190 | A | | 11/1995 | Meunier et al. .............. 361/91 |
| 5,508,548 | A | | 4/1996 | Tailliet ....................... 257/360 |
| 5,513,060 | A | | 4/1996 | Bremond ..................... 361/58 |
| 5,515,225 | A | | 5/1996 | Gens et al. .................. 361/56 |
| 5,657,195 | A | | 8/1997 | Rault .......................... 361/86 |

FOREIGN PATENT DOCUMENTS

JP 61211715 A 9/1986

* cited by examiner

*Primary Examiner*—Sue Purvis
*Assistant Examiner*—Scott R. Wilson
(74) *Attorney, Agent, or Firm*—Gardere Wynne Sewell LLP

(57) ABSTRACT

In an integrated circuit, a diode is interposed between the semiconductor substrate and the contact pad to an external bias voltage, and the substrate is biased at an internal voltage reference. Between each contact pad of the integrated circuit and semiconductor substrate, there is positioned a protection device against permanent overloads and a protection device against electrostatic discharges. By isolating the semiconductor substrate from the external voltages source and by placing a protection device between each contact pad and the substrate, a broad, general protection of the integrated circuit is obtained against all the destructive phenomena such as overloads, positive and negative overvoltages, polarity reversal and electrostatic discharges.

34 Claims, 5 Drawing Sheets

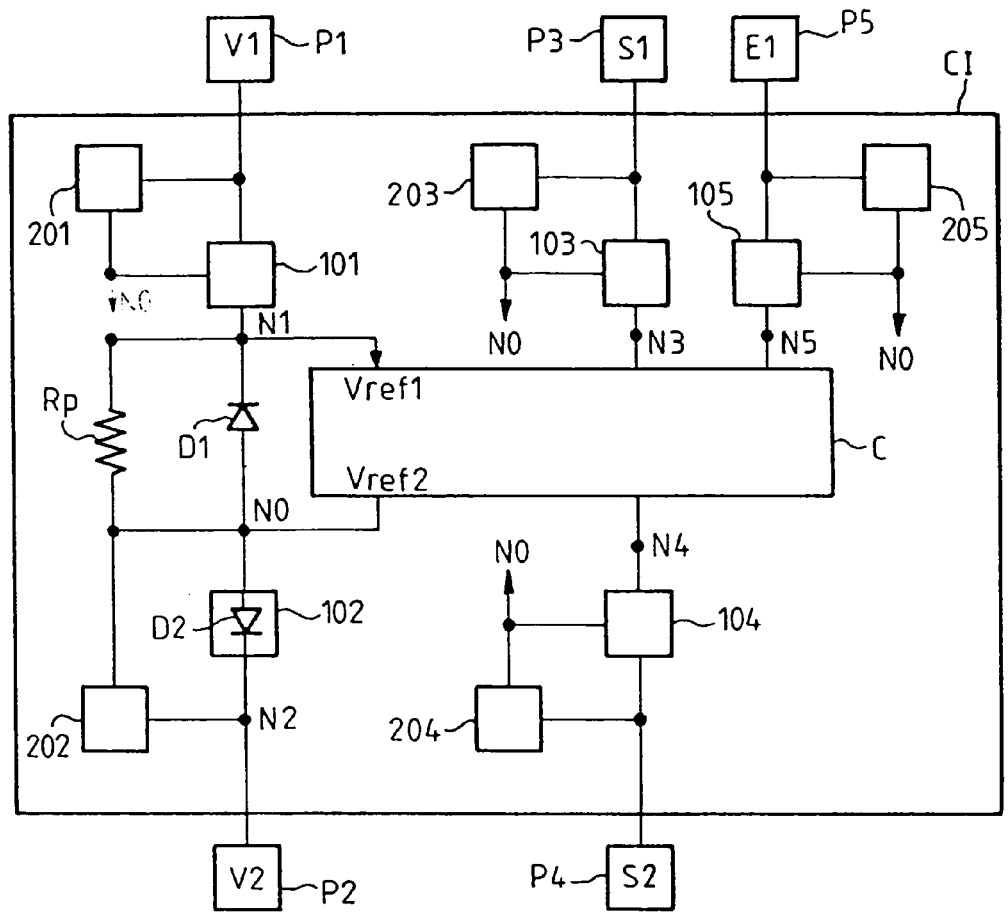
FIG_1
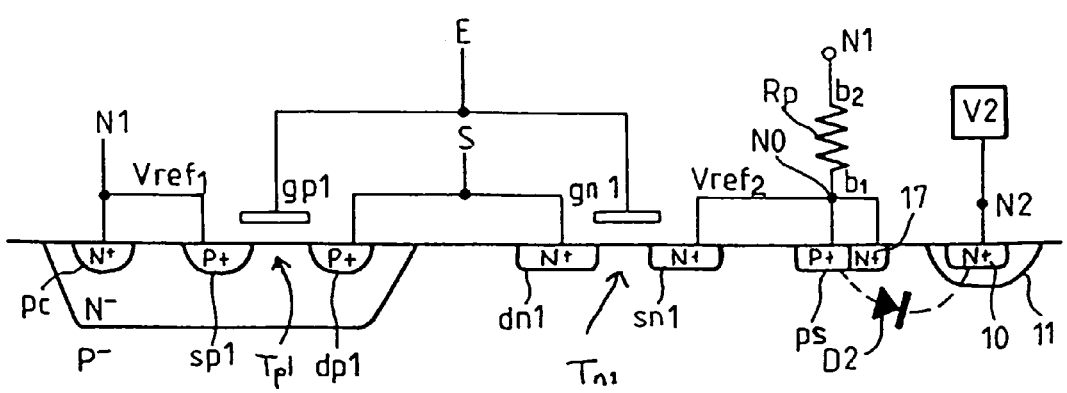
FIG_2

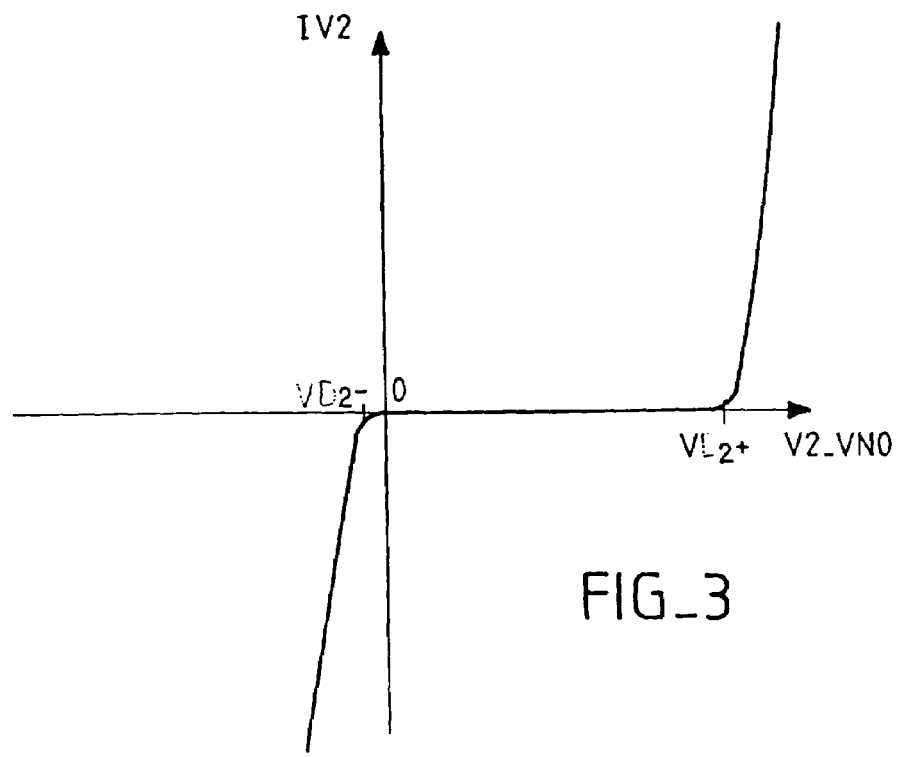
FIG_3
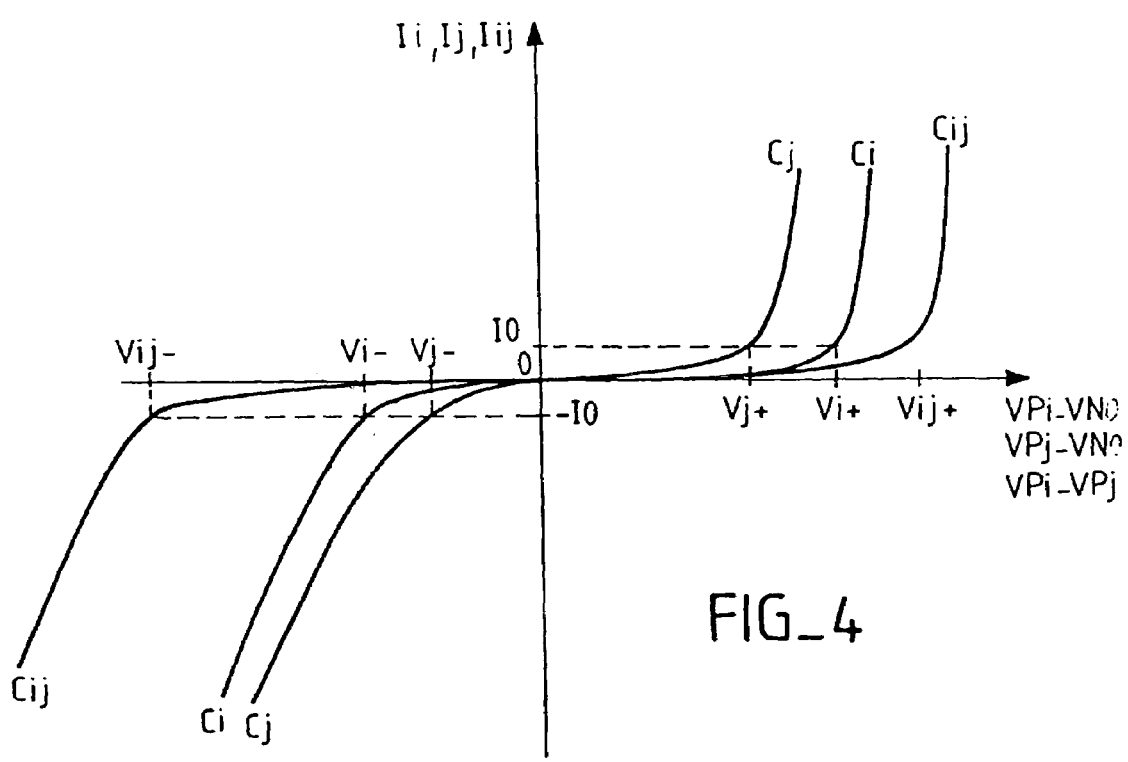
FIG_4

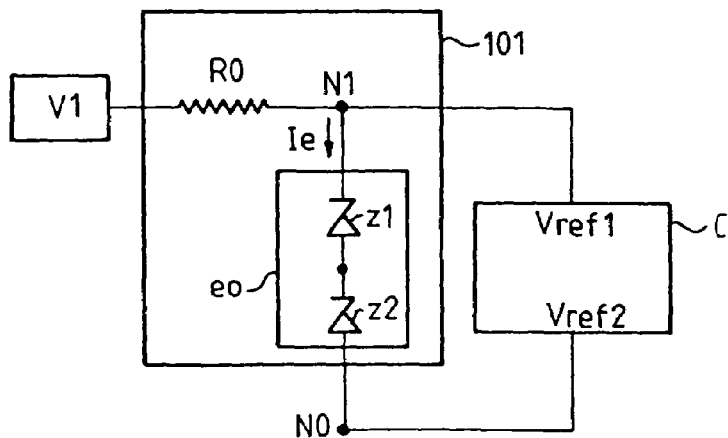
FIG_5
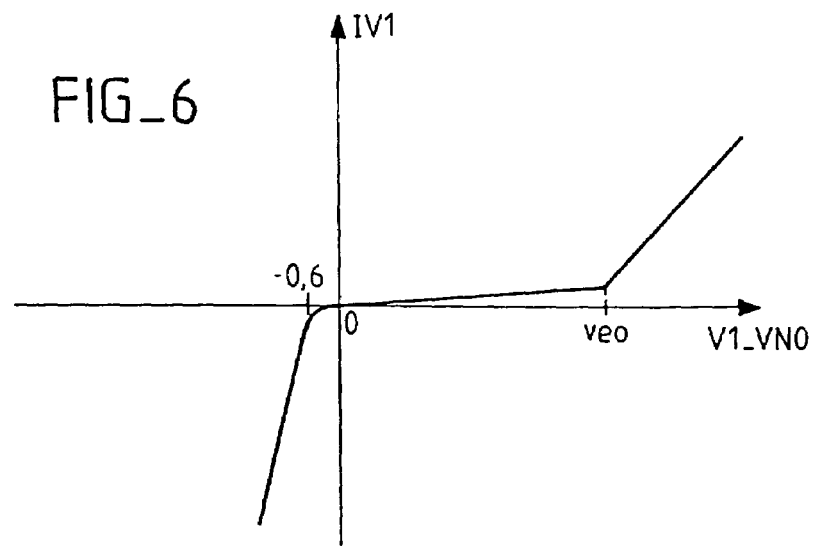
FIG_6
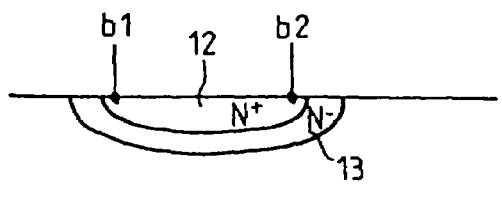
FIG_7b
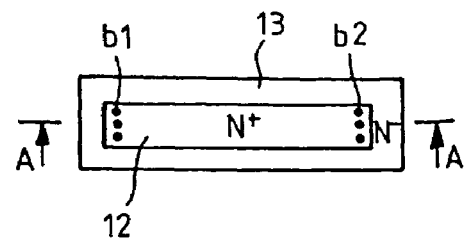
FIG_7a

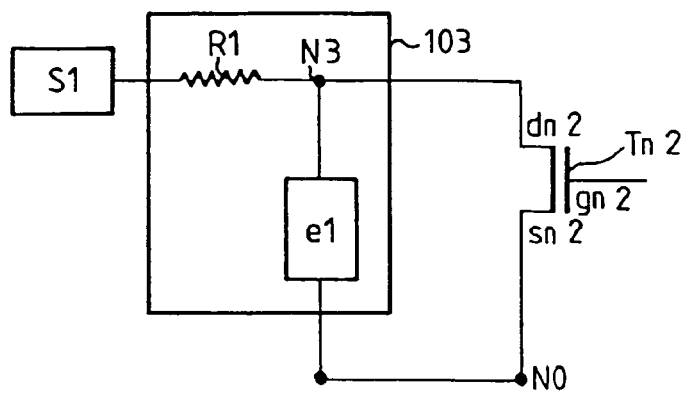
FIG_8
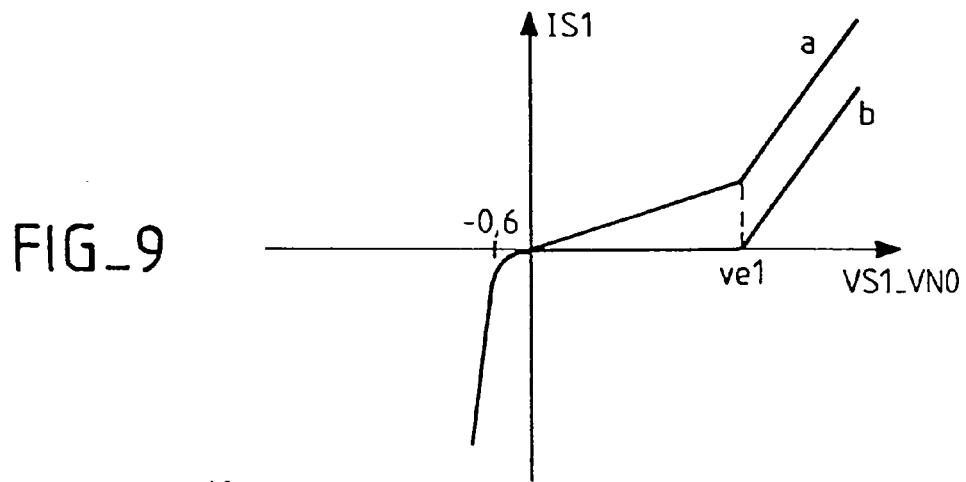
FIG_9
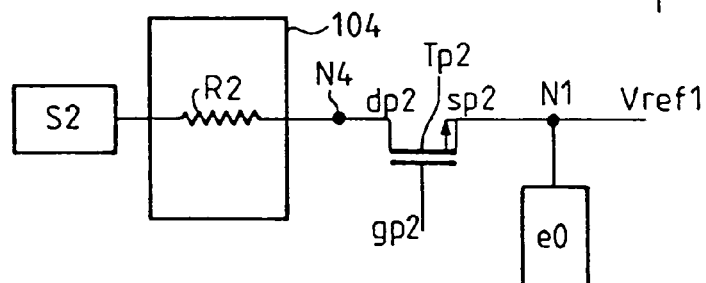
FIG_10
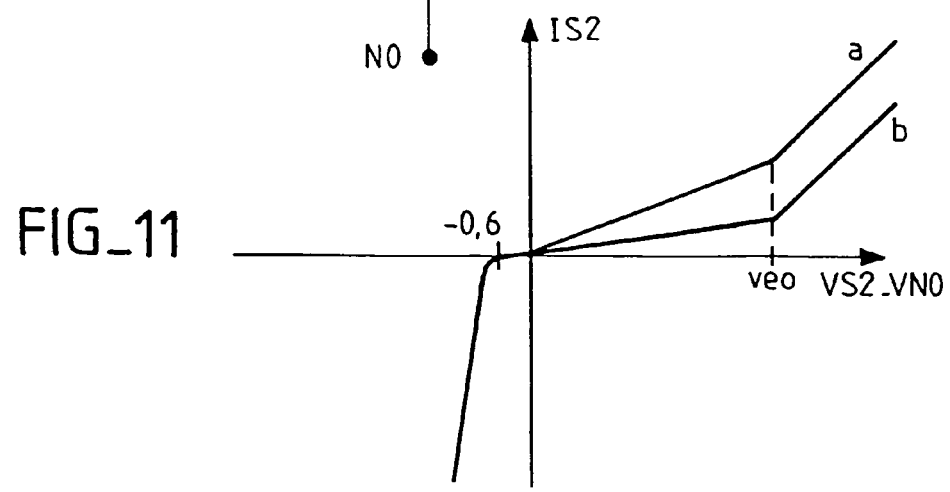
FIG_11

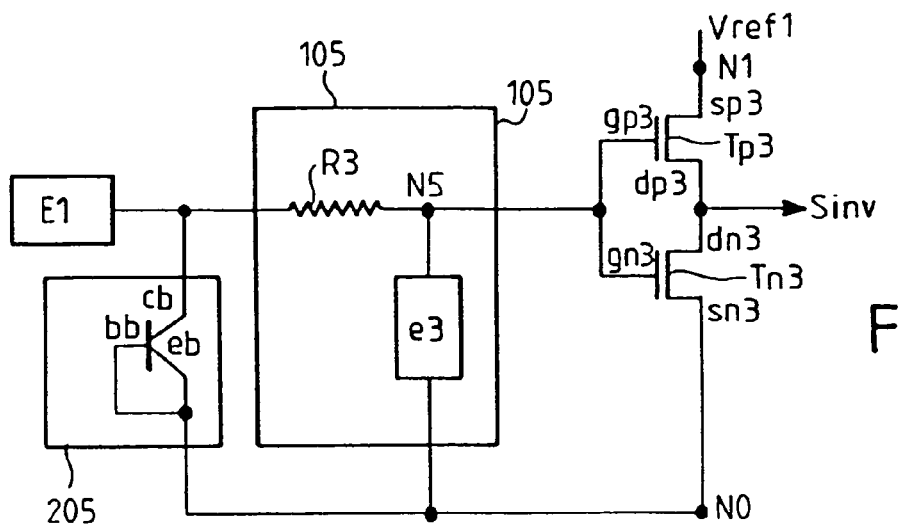
FIG_12
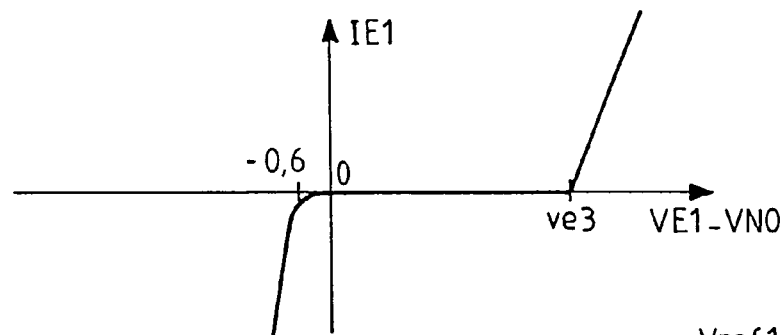
FIG_13
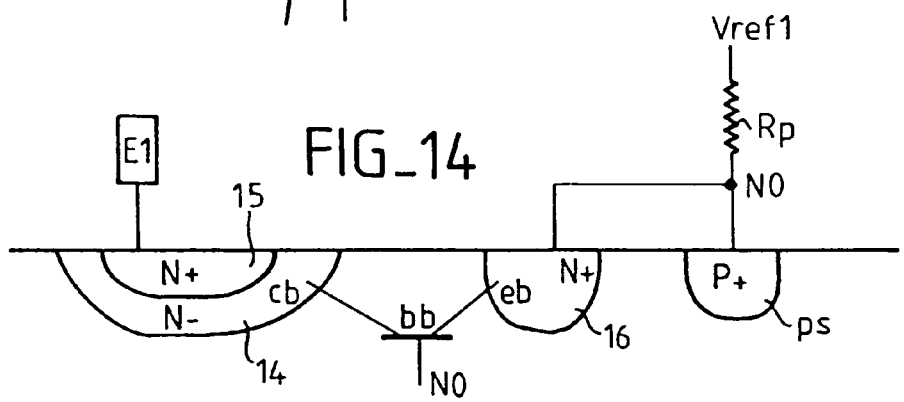
FIG_14
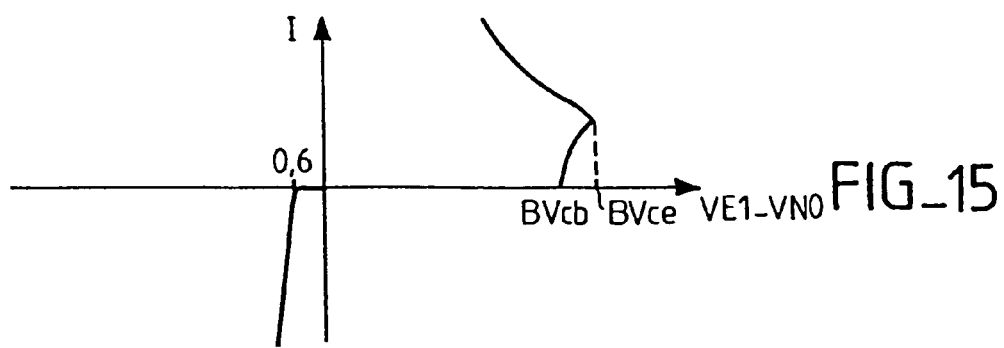
FIG_15

GENERAL PROTECTION OF AN INTEGRATED CIRCUIT AGAINST PERMANT OVERLOADS AND ELECTROSTATIC DISCHARGES

CROSS-REFERENCE TO RELATED APPLICATION

This application is a continuation of Application Ser. No. 08/488,131 filed on Jun. 6, 1995 now abandoned, which is a divisional of Application No. 07/999,527, filed on Dec. 29, 1992 (issued on Aug. 1, 1995 as U.S. Pat. No. 5,438,213).

This application claims priority from French App'n 91-16411, filed 31 Dec. 1991, which is hereby incorporated by reference.

BACKGROUND AND SUMMARY OF THE INVENTION

The invention relates to integrated circuits with intrinsic protection both against electrostatic discharges and also against permanent overloads, such as reversals of polarity or overvoltages.

The disclosed inventions can be used to provide integrated circuits with very wide-ranging protection against deliberate destruction wrought with malicious or fraudulent intent and accidental destruction prompted by static electricity, lightning and magnetic storms or through mishandling or human error (resulting in reversal of polarity, overvoltage etc.).

The widespread use of integrated circuits is raising new protection problems, especially in the field of computerized money systems with bank cards that use a single microcircuit for all electronic functions. There is therefore no longer any electronic environment possible that could enable external protection of the integrated circuit. For example, it is no longer possible to use discrete protection components such as special limiter diodes and non-linear resistors for protection against permanent overloads.

Moreover, for these very same reasons, and also because the new technologies are leading to increasingly fragile circuits, it is necessary to identify all the destructive phenomena and protect the entire integrated circuit (and no longer just certain inputs or outputs) against certain destructive phenomena. It is thus becoming necessary to provide the circuit with totally "intrinsic" protection against both electrostatic discharges and permanent overvoltages, including reversals of polarity, by means of an integrated protection structure.

Usually, for a given type of contact pad, it is sought to identify the problem that arises therein for a particular phenomenon and to resolve it.[1]

[1] A wide variety of structures have been proposed for electrostatic discharge protection. For example, in French patent application No. 91/11007 filed on behalf of the present Inventor, a voltage follower device is thus placed between the drain and the gate of an output transistor with open drain as a protection device against the electrostatic discharges that affect the gate oxide at the position of the drain. Other proposed structures may be found in U.S. Pat. Nos. 5,032,742 (which includes both a series resistance and shunt diodes on a signal input), 4,882,502, 4,876,584, 4,858,055, 4,736,271, 4,716,302, 4,617,482, 4,580,063, 4,438,352, 4,061,928, 4,057,844, 4,032,800, 3,967, 295, 3,947,727, 3,712,995, and 3,673,428, all of which are hereby incorporated by reference.

In the invention, there is proposed a strategy of protection that can be applied simultaneously to every destructive phenomenon. The original approach of the invention consists in modifying the current-voltage input characteristic of each of the contact pads of the integrated circuit with respect to a common electrical node internal to the integrated circuit. Advantageously, the internal electrical node is the electrical node of the semiconductor substrate of the integrated circuit. Whereas the semiconductor substrate is usually short-circuited at a contact pad to an external reference voltage (for example a P type substrate is usually biased to the ground Vss), in the invention the semiconductor substrate is isolated from this contact pad and it is biased internally. This original approach further makes it possible advantageously to resolve the problem of protection against polarity reversals.

The invention therefore provides an integrated circuit made out of a semiconductor substrate with a first type of doping, comprising contact pads for the connection of internal functional nodes to external signals, the integrated circuit having a first internal voltage reference delivered by a contact pad to a first external voltage source, the semiconductor substrate being biased at a second internal reference voltage, wherein a diode is connected between the semiconductor substrate and a contact pad to a second external reference voltage source, and wherein the diode is forward biased in the state of normal bias of the integrated circuit and is reverse biased in the state of reverse bias of the integrated circuit by the second internal voltage reference of the integrated circuit.

In the invention, protection devices are advantageously placed between each of the contact pads and the internally biased substrate and, by this original approach, there is obtained a general protection of the integrated circuit against all the destructive phenomena.

The invention relates to an integrated circuit with a protection device against overvoltages between each of the contact pads and the semiconductor substrate.

The invention also relates to a method for the manufacture of an integrated circuit biased by a first external bias voltage and a second external bias voltage wherein, in a semiconductor substrate with a first type of doping, there is made a diffusion of a second type of doping, the substrate being biased by an internal reference voltage in such a way that the substrate and the diffusion form a forward biased diode in the state of normal bias of the integrated circuit and a reverse biased diode in the state of reverse bias of the integrated circuit.

In one class of embodiments, overvoltage protection of a single polarity (e.g. against positive overvoltages) is provided on all contact pads.

In one class of embodiments, the electrostatic-discharge-protection device is conveniently merged with the overvoltage protection circuitry.

In one class of embodiments, the electrostatic-discharge-protection device is a lateral bipolar transistor with a relatively high trigger voltage (close to the reverse breakdown voltage of the substrate isolation diode). Thus the ESD protection device will not hamper the working of the device for protection against permanent overloads.

In the sample embodiment of FIG. 1, there is an overvoltage-protection device 10$i$ (including current-limiting resistor plus voltage limiter) between each contact pad Pi and the associated internal electrical node Ni; and, in parallel, between each contact pad Pi and the substrate node N0, there is an electrostatic-discharge-protection device 20$i$.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows a general electrical diagram of an integrated circuit modified according to the invention;

FIG. 2 shows a device for the isolation of a P type substrate according to the invention, using a diode D2;

FIG. 3 shows the curve of current-voltage at the terminals of the diode D2 of the device of FIG. 2;

FIG. 4 shows the respective current-voltage curves of two contact pads protected according to the invention, and the resultant current-voltage curve between these two pads;

FIG. 5 shows a device for the protection of a contact pad for connection to an external supply voltage according to the invention;

FIG. 6 shows the current-voltage curve of the contact pad for connection to an external supply voltage of the device of FIG. 5;

FIGS. 7a and 7b show an embodiment, in diffusion form, of a current limiting resistor used in the invention, seen respectively in a top view and in a section along AA;

FIG. 8 shows a device for the protection of an N type output transistor for a P type semiconductor substrate according to the invention;

FIG. 9 shows the current-voltage curve of the N type output transistor of the device of FIG. 8;

FIG. 10 shows a device for the protection of a P type output transistor for a P type semiconductor substrate according to the invention;

FIG. 11 shows the current-voltage curve of the P type output transistor of the device of FIG. 10;

FIG. 12 shows a device for the protection of the input gate of a CMOS inverter according to the invention;

FIG. 13 shows the current-voltage curve at the input of the CMOS inverter of the device of FIG. 12;

FIG. 14 shows a particular embodiment of a lateral bipolar transistor for protection against electrostatic discharges, according to the invention;

FIG. 15 shows a current-voltage characteristic curve of the lateral bipolar transistor of FIG. 14.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIG. 1 shows an example of an integrated circuit CI with intrinsic (on-chip) protection according to the invention. The integrated circuit has contact pads P1, P2, P3, P4, P5 for the connection of internal electrical nodes N1, N2, N3, N4, N5 to external power and input/output connections V1, V2, S1, S2, E1.

The external signal[2] V1 is given by a first external supply source which is not shown in the Figure. The external signal V2 is given by a second external supply source which is not shown in the Figure.

[2]For convenience, the contact pad is identified with the associated external signal in the following discussion. Thus, V1 designates the contact pad and the external supply signal without distinction.

Between the internal electrical node N1 and an internal node N0, there is a diode D1. Between the internal node N0 and the internal electrical node N2, there is a diode D2. The diodes D1 and D2 are mounted in opposition between the internal electrical nodes N1 and N2: in the state of normal bias of V1 and V2, the diode D1 is off and the diode D2 is on; in reverse bias, the opposite is the case. In the described example of a circuit with a P type substrate, where V1 is a positive voltage of the order of five volts and V2 is the zero voltage, it is therefore the cathode of the diode D1 which is connected to the internal electrical node N1 associated with V1; the cathode of diode D2 is connected to the internal electrical node N2 associated with V2; and the anodes of the diodes D1 and D2 are connected together to the internal node N0.[3]

[3]In an alternative example using an N type substrate, where it is V2 that is the positive voltage (e.g. of the order of five volts) and V1 that is the zero voltage, it is therefore the anode of the diode D1 which is connected to the internal electrical node N1 associated with V1. The anode of the diode D2 is connected to the internal electrical node N2 associated with V2, and the cathodes of the diodes D1 and D2 are connected together to the internal node N0.

A bias resistor Rp is placed in parallel to the diode D1, between the nodes N1 and N0.

The node N1 gives a first internal reference voltage Vref1 to the circuitry C of the integrated circuit.

The node N0 gives a second internal reference voltage Vref2 to the circuitry C of the integrated circuit and biases the substrate at this voltage Vref2. The node N0 will therefore often be referred to herein as the "substrate node" N0. The voltage at the substrate node N0 will be referenced as VN0 (equal to Vref2). The circuitry receives its other input-output signals S1, S2, E1 from the internal electrical nodes N3, N4, N5 associated with the other contact pads P3, P4 and P5.

Between each contact pad[4] Pi and the associated internal electrical node Ni, there is a protection device 10i against overvoltages connected to the electrical node N0 of the substrate. In parallel, between each contact pad Pi and the substrate node N0, there is an electrostatic-discharge-protection device 20i. The characteristics of these protection devices are described in detail further below.

[4]In the specific example shown, i may range from 1 to 5; but of course other implementations are possible, as will be readily appreciated by those of ordinary skill in the art.

In a standard integrated circuit, the current-voltage characteristic between the first power supply line V1 and the semiconductor substrate (which is short-circuited to the other power supply line V2) corresponds to that of a diode which is inherent in the structure of the circuit (like diode D1 in FIG. 1). This diode typically has a forward voltage of the order of 0.6 volts and a reverse voltage of the order of 15 to 20 volts, depending on the characteristics of manufacture of the integrated circuit.

The diode D1 inherent in the structure of the circuit is off in the state of normal bias of the integrated circuit, and goes into forward bias when the integrated circuit is reverse biased (by reversal of the voltages V1 and V2). Since the semiconductor substrate of an integrated circuit is conventionally short-circuited to V2 by a substrate contact, if a reversal of polarity occurs between V1 and V2 and if this reverse voltage between V1 and V2 is greater than the threshold in the state of forward bias (0.6 volts) of the diode D1, this diode D1 goes into forward bias and draws a strong current between V1 and V2 (which can destroy the integrated circuit).

In the invention (FIG. 1), a diode D2, weakly forward biased in the normal bias of the circuit, is placed between the substrate and the external voltage V2. In the example shown, the bias of the diode D2 is ensured by the bias resistor Rp which is placed between the node N1 and the substrate node N0 and is hence parallel-mounted with the parasitic diode D1. This bias resistor imposes a voltage, on the substrate node N0, that is close to the second external reference voltage V2 habitually used to bias the substrate.

In the invention, this bias voltage at the substrate node N0 is used as a second internal reference voltage Vref2 of the circuitry C of the integrated circuit: the value of this second internal reference voltage Vref2 is therefore offset by about 0.6 volts (the threshold in the state of forward bias of the diode) with respect to the second external reference voltage V2 used in the prior art as a second internal reference voltage and as a bias voltage of the substrate.

The following discussion will relate specifically to the example of an integrated circuit, manufactured by CMOS technology, with a P– substrate. This is a non-restrictive example that can be easily transposed to other technologies (CMOS with N– substrate, NMOS, PMOS, bipolar technologies, or a mixture of these technologies). In this example, the first external reference voltage V1 is a positive voltage Vcc and the external reference voltage V2 is a more negative (typically zero) voltage Vss. Under these conditions, the magnitude of the second internal reference voltage Vref2 is of the order of 0.6 volts.

FIG. 2 shows the drawing of a CMOS inverter with a device 102 for the protection of the substrate according to the invention. The standard CMOS inverter is formed by P type transistor Tp1 (with a gate gp1, a source sp1 and a drain dp1) and an N type transistor Tn1 (with a gate gn1, a source sn1 and a drain dn1). The P type transistor referenced Tp1 is made in an N– well and the N type transistor referenced Tn1 is made in the P– substrate. The gates gp1 and gn1 of the transistors Tp1 and Tn1 are connected together and form the input E of the inverter. The drains dp1 and dn1 of the transistors Tp1 and Tn1 are connected together and form the output S of the inverter.

The source sn1 of the transistor Tn1 is connected to the second internal reference voltage Vref2. Furthermore, a substrate contact ps (P+ diffusion made in the P-type substrate) connects the P– substrate to this second internal reference voltage. The second internal reference voltage is delivered by a terminal b1 of the bias resistor Rp connected by its other terminal b2 to the first internal reference voltage Vref1.

The source sp1 of the transistor Tp1 is connected to the internal electrical node N1 associated with the external voltage V1. The node N1 is furthermore connected to the N– well by a well contact pc (N+ diffusion in the N– well).

The isolation diode D2 of the protection device 102 is made by an N+ diffusion 10 and the P– substrate. The N+ diffusion 10 is connected with the internal electrical node N2 associated with the external voltage V2. A diode such as this has a threshold voltage of the order of 0.6 volts in forward bias and between 15 and 20 volts in reverse bias.

Preferably, as shown in FIG. 2, the diode D2 is made by CMOS well technology, with the N+ diffusion 10 being entirely buried in an N– well 11 (the + or – sign indicating a greater or a smaller concentration of doping impurities). Thus, a diode reverse voltage threshold of about a hundred volts is obtained.

With the device for the isolation of the substrate according to the invention, in the event of polarity reversal, the diode D1 goes into forward bias as in the prior art, but the isolation diode D2 goes off. For a negative voltage V1-V2, there is no longer any passage of current between V1 and V2 (as long as this voltage does not exceed the reverse voltage threshold of the diode D2). The incursion of negative voltage admissible at V1 is however limited by the reverse voltage threshold of the diode D2: 15 to 20 volts with a standard diode technology, 100 volts in n-well CMOS technology. Beyond the reverse voltage threshold, the diode D2 conducts by avalanche process.

A complementary N+ diffusion 17 connected to the node N0 is represented in FIG. 2, placed between the substrate contact and the N– well 11. The utility of this diffusion will be described further below.

The current-voltage characteristic curve shown in FIG. 3 is that of the P2-to-V2 contact pad with respect to the substrate node N0. It is therefore the curve of current-voltage at the terminals of the diode D2. In the example of a well diode D2 in CMOS technology, its threshold in forward bias is 0.6 volts and its threshold in reverse bias is about a hundred volts. The curve gives the current as a function of the voltage V2-VN0. This is why the forward threshold is referenced negatively (VD2–=–0.6 volts) and the reverse threshold is referenced positively (VD2+=100 volts). Between –0.6 volts and 100 volts, the diode current is practically zero (open circuit). Beyond the two thresholds in terms of absolute value, the current increases very greatly, notably beyond the reverse voltage threshold VD2+ with the placing of the diode D2 in avalanche mode. It will therefore be preferred to use the well diode in CMOS technology which has a high reverse voltage threshold. As a quid pro quo, this choice may necessitate an additional implantation level for the making of the well of the diode (D2), for example for an integrated circuit in NMOS technology, which will increase the manufacturing costs. It could then be preferable, in certain cases, to have a standard N+/P– technology.

In the invention, therefore, the substrate has been isolated from the contact pad to V2 by the diode D2 which is forward biased in normal operation. This effectively resolves the problem of reversal of polarity, on the one hand, and enables the substrate to be isolated internally on the other hand. In the invention, a protection device $101, \ldots, 105$ is advantageously placed between each of the contact pads V1, V2, S1, S2 and E1 and the substrate node N0 (FIG. 1) to modify the current-voltage characteristic curve of each of the contact pads with respect to the common node N0. With each of the protection devices, there will indeed be obtained, for the associated contact pad, a current-voltage characteristic curve, with respect to the substrate node N0, having the shape shown in FIG. 4: for a voltage VPi-VN0, between the contact pad Pi and the substrate node N0, ranging between a negative threshold Vi– and a positive threshold Vi+, the current IPi ranges between a limit current –I0 and +I0 of low value. This limit current I0 is determined for a given integrated circuit, as the smallest value of the acceptable maximum current Imax in a contact pad Pi on all the n contact pads of the integrated circuit: $I0=\text{Inf}_{1 \leq i \leq n}$ Imax. In practice, I0 has a value in the neighborhood of ten milliamperes, for example 10.0 milliamperes.

With such a structure, a general protection of the integrated circuit will be obtained against the overvoltages or other destructive phenomena. Let us therefore take two contact pads Pi, Pj for which there is this type of associated current-voltage characteristic curve Ci, Cj (FIG. 4). The characteristic curve Ci is defined for the limit current I0 with a negative threshold Vi– and a positive threshold Vi+ with respect to the common node N0. The characteristic Cj is defined for the limit current I0 with a positive threshold Vj– and a negative threshold Vj+ with respect to the common node N0.

The resultant characteristic curve Cij between the contact pad Pi and the contact pad Pj is then easily deduced from the following relationship:

$$Vi-Vj=(Vi-VN0)-(Vj-VN0)$$

Thus, for a voltage between a negative threshold Vij− given by the relationship (1):

$$Vij-=Vi--Vj+ \quad (1)$$

and a positive threshold Vij+ given by the relationship (2):

$$Vij+=Vi+-Vj- \quad (2)$$

the current flowing in the contact pad Pi or Pj will be lower than the limit current I0.

If this reasoning is extended to all the contact pads of the integrated circuit, with a current-voltage characteristic curve having the shape shown in FIG. 4 for each of them, there then exists a value of voltage VM that is lower in terms of absolute value than all the possible values Vij+ or Vij−, given by the relationship (3):

$$VM=Inf_{i,j}(Vij+, Vij-) \quad (3)$$

This voltage value VM is such that, applied between any two contact pads of the integrated circuit, the current in each of the two contact pads will be lower in terms of absolute value than the limit current I0. Thus, by using the isolated substrate according to the invention as a node N0 common to all the contact pads and by placing a protection device 10*i* between each of the contact pads Pi and the substrate, a general protection of the integrated circuit is obtained. In the invention, it is sought to make VM as great as possible, namely of the order of about a hundred volts. It would therefore be necessary, for each contact pad Pi, to obtain a condition where the positive threshold Vi+ and negative voltage Vi− are as great as possible.

Now, from the relationships (1), (2) and (3) it follows that, if action is taken on only one of the parameters of the relationships (1) and (2), the same one in each of the relationships (1) and (2), for example the positive threshold Vi+, Vj+, so as to obtain a value of the order of 100 volts for this parameter Vi+, Vj+, for each possible pair of contact pads, the negative threshold Vij− and the positive threshold Vij+ given by the relationship (3) will be at least of the order of 100 volts, even if the negative thresholds Vi−, Vj− of the contact pads are equal to only −0.6 volts.

In the invention, it is therefore proposed advantageously to place a protection device against the positive overvoltages between each contact pad and the substrate node N0. The structure obtained will enable a general protection against the positive and negative overvoltages. Indeed, if a negative overvoltage occurs at a contact pad Pi, there will be another contact pad Pj for which this overvoltage will appear to be positive with respect to the substrate node N0 and the associated protection device 10*j* could limit the current drawn. There are several possible embodiments with protection devices against either positive voltages only or negative voltages only or, again, with combined devices. The sample embodiment described below protects contact pads against positive voltages of up to about a hundred volts, but of course this embodiment does not necessarily limit the claimed inventions.

FIG. 5 shows an example of a protection device 10*i* for a contact pad providing connection to an external supply source V1, comprising a voltage limiter e0 and a current limiting resistor R0.

The voltage limiter e0 is placed between the node N1 associated with V1 and the substrate node N0. Downline from the limiter, between the node N1 and the substrate node N0, is the internal circuitry C of the integrated circuit, which receives the first internal reference voltage Vref1 from the node N1 and the second reference voltage Vref2 from the node N0. The limiter has a triggering threshold ve0 below the threshold in the state of reverse bias of the diode D1 (10-15 volts). This triggering threshold ve0 is equal, for example, to 12 volts. Thus, in the case of positive overvoltage with respect to N0, the limiter e0 gets triggered before the diode D1 and it absorbs all the current Ie. In the example of FIG. 5, the limiter e0 is formed by zener diodes z1 and z2 in series and in reverse, made according to the CMOS method described in the Italian patent No. 22228 A/89 filed on behalf of Sgs-Thomson Microelectronics s.r.l. on 31 Oct. 1989, which is hereby incorporated by reference. Other embodiments are possible, for example with transistors as diodes.

The limiting resistor R0 is placed between V1 and the associated internal node N1 to limit the current Ie flowing in the limiter e0 to values that are not destructive for the limiter e0. The value of this limiting resistor should be low enough not to prompt a voltage drop on the first internal reference voltage Vref1, since we then have Vref1=V1−(R0×Ist), where Ist is the consumption of the integrated circuit on V1 in normal operation. The value of the limiting resistor should also be high enough to limit the current Ie sufficiently in the limiter e0. In practice, if Icrit denotes the limit current acceptable in the limiter, if protection is sought against overvoltages, for example of up to VM, the triggering threshold of the limiter e0 being referenced ve0, a value of R0 will be taken such that: Icrit=VM−ve0 R0.

Thus, up to VM volts, the limiter e0 will be capable of absorbing all the drawn current and the integrated circuit will not be damaged. In one example, with VM equal to 100 volts and ve0 equal to 12 volts, and for a critical current Icrit of 440 milliamperes, R0 is equal to 200 ohms. If the circuit consumes 1 milliampere on V1 in normal operation, the voltage drop in the limiting resistor R0 is equal to 200 millivolts, which is acceptable.

In general, the parameters of the different elements (limiter, resistor) of the protection device 10*i* are well known and are calculated or chosen according to the methods known to those skilled in the art. The resistor R0 may be made of polysilicon or may be formed by an N+ type diffusion.

In a preferred example shown in FIGS. 7*a* and 7*b*, the limiting resistor R0 is an N+ diffusion 12 entirely made in an N− well 13. The contact terminals b1 and b2 are made at the edge of a well, each at one opposite end of the diffusion 11. Indeed, if the limiting resistor is a simple N+ diffusion of the type constituting the drain of an N type transistor, there is created an N+/P− type parasitic diode with the substrate with a reverse threshold of between 15 and 20 volts. The limiter e0 will then no longer fulfil its purpose, since the parasitic diode of the resistor will go into avalanche breakdown between 10 and 15 volts, and the voltage at the terminals of the limiter could never go beyond this avalanche voltage.

The resultant current-voltage characteristic between the contact pad at V1 and the substrate node N0 is shown in FIG. 6. For a negative voltage with respect to the voltage VN0 of the substrate node, there will always be a PN junction (of the diode D1 type) to be put into forward bias. This PN junction typically clips the voltage V1−VN0 to −0.6 volts. For a voltage applied to V1 that is positive with respect to the voltage VN0 of the substrate node N0, the current IV1 drawn at V1 increases slightly between 0 volts and the limiter triggering threshold voltage Ve0. This part of the characteristic corresponds to the static consumption of the integrated circuit on V1. The voltage limiter is triggered for a positive voltage V1-VN0 greater than Ve0 by about 12 volts before the parasitic diodes of the diode D1 type (FIGS. 1, 2) go into avalanche breakdown. The triggered voltage limiter absorbs all the current. The current-voltage characteristic has a slope that is inversely proportional to the current limiting resistor R0: when the voltage limiter is triggered, the equivalent circuit between V1 and N0 consists of the current limiting resistor R0 in series with a voltage generator Ve0.

A protection device 101 such as this, which can be applied to the positive voltage V1 (Vcc), can be equally well applied to any other external positive voltage. If the voltage V1 were to be negative, for example for an integrated circuit with N-substrate, the protection device 101 would be applicable to the other external negative voltages. In the prior art, in the event of positive voltage on V1, the diode D1 which is between V1 and V2 and is inherent in any integrated circuit structure goes into avalanche breakdown beyond 15 to 20 volts, and the very high current drawn will destroy the circuit by prompting a short-circuit between V1 and V2.

FIG. 8 shows a device 103 for the protection of a drain dn2 of an N type transistor Tn2 mounted as an output transistor with open drain: the drain dn2 is connected, for example, to the contact pad S1 (FIG. 1), the gate gn2 of the transistor Tn2 is controlled by an internal circuit element (not shown), and the source sn2 is connected to the substrate node N0. In this example (FIG. 8), the same type of protection device with a voltage limiter e1 and a current limiting resistor R1 is proposed. For a positive overvoltage, there is indeed a risk that the drain-substrate diode of the transistor Tn2 will go into avalanche breakdown towards 15-20 volts: the same problem already seen for the connection to external supply voltage V1 is encountered again, and an identical solution is therefore proposed.

The resistor R1 is connected between S1 and the associated internal electrical node N3, and the voltage limiter e1 is connected in parallel to the transistor Tn2 between the node N3 and the substrate node N0. The characteristics of the protection device 103 itself (value of R1 for example) will depend on the characteristics of the output stage. For example, for a low output impedance, R1 should also be as low as possible.

The current-voltage characteristic curve of the contact pad S1 with respect to the substrate node N0 with the protection device according to the invention is shown in FIG. 9. Two current voltage characteristics a and b are obtained with the protection device, depending on whether the output transistor Tn2 is on (positive voltage controlled on gn2) or not. For a voltage VS1-VN0 between 0 and the triggering threshold ve1 of the voltage limiter (about 12 volts), if the output transistor Tn2 is on (characteristic a), it is equivalent to a resistor RON. The equivalent circuit seen from S1 between S1 and N0 therefore corresponds to the current limiting resistor R1 in series with the equivalent resistor RON of the transistor Tn2, namely to an overall resistor Req1=R1+RON. The current-voltage characteristic therefore has a slope equal to 1/Req1. Beyond the triggering threshold ve1 of the voltage limiter, the voltage limiter gets triggered and absorbs all the current: the current flowing in the transistor Tn2 is then limited to Ve1/RON and the equivalent circuit is reduced to the current limiting resistor R1 in series with a voltage generator ve1. Beyond the triggering threshold ve1, the current-voltage characteristic therefore has a slope equal to 1/R1.

If the transistor Tn2 is off (characteristic b), it is equivalent to an open circuit so long as the reverse threshold of the drain-substrate diode is not reached. For a voltage VS1-VN0 below the triggering threshold ve1, the voltage limiter e1 itself being also off, there is no current whatsoever: the equivalent circuit between S1 and N0 is an open circuit: the current-voltage characteristic has a zero slope. Beyond ve1, the voltage limiter e1 gets triggered and the equivalent circuit between S1 and N0 is the current limiting resistor R1 in series with a voltage generator ve1. The current-voltage characteristic, starting from the voltage VS1-VN0 equal to ve1, has a slope equal to 1/R1.

FIG. 10 shows a protection device 104 for the drain dp2 of a P type transistor Tp2 mounted as an output transistor with open drain, said protection device 104 comprising a current limiting resistor R2.

The drain dp2 of the transistor Tp2 is connected, for example, at the contact pad S2 of FIG. 1, to the associated internal node N4. The source sp2 of the transistor Tp2 is connected at the node N1 to the positive internal reference voltage Vref1. The gate gp2 of the transistor Tp2 is controlled by an internal circuit element (not shown). The N-well in which the transistor Tp2 is located (in P- substrate CMOS technology) is connected by a well contact to node N1 (which is at voltage Vref1). This well contact connection is represented in the Figure by an outgoing arrow (P type channel) perpendicular to the bar representing the source-drain channel of the transistor, the tip of the arrow being attached to the source sp2.

The voltage limiter e0, associated with the contact pad to V1 according to the invention is seen again between the node N1 and the substrate node N0.

The limiting resistor R2 of the current in the contact pad to S2 is placed in series between S2 and the associated internal node N4.

When the voltage VS2-VN0 is positive, the drain-well junction of the transistor Tp2 goes into forward bias from about 0.6 volts onwards. The well is also connected to the voltage limiter e0 associated with V1. Hence, beyond 0.6 volts, the voltage imposed by the contact pad S2 at the node N1 of the voltage limiter e0 is reduced by the drop in voltage in the limiting resistor R2 and by the 0.6 volt drop in voltage in the drain-well junction of the transistor Tp2. The situation of FIG. 5 is practically seen again for the protection associated with V1.

In a preferred embodiment, therefore, no particular voltage limiter is used at the drain dp2 of the P type output transistor Tp2 with open drain but, advantageously, what is used is the voltage limiter e0 associated with the voltage V1 which biases the well of this output transistor Tp2.

The static characteristics a,b (with the circuit not supplied) in terms of current-voltage of FIG. 10 are shown in FIG. 11. They correspond to that of FIG. 9 for the N type transistor, on (a) or off (b) with, moreover, the static consumption on V1 which is added in both cases (a) and (b) so long as the voltage VS2-VN0 is below the triggering threshold ve0 of the voltage limiter e0. Beyond the threshold ve0, the two characteristics have a slope equal to 1/R2. FIG. 12 shows a protection device 105 of an input stage with CMOS inverter, comprising a voltage limiter e3 and a current limiting resistor R3.

The CMOS inverter is formed in a known way by a P type transistor Tp3 and an N type transistor Tn3. Their drains dp3 and dn3 are connected together to the output Sinv of the inverter. Their gates gp3 and gn3 are connected together at the contact pad E1 to the node N5 of FIG. 1. Their sources sp3 and sn3 are respectively connected to the first internal reference voltage Vref1 at the node N1 and to the second internal reference voltage Vref2 at the substrate node N0. The current limiting resistor R3 is placed between the contact pad E1 and the node N5 and the voltage limiter e3 is connected between the second node N5 and the substrate node N0.

In the event of positive overvoltages, the well-known problem that arises is that of the dielectric breakdown of the gate oxide between the gate and the channel of the transistor, said breakdown being prompted by a voltage between the gate and the substrate that is higher than a gate oxide breakdown voltage typically of the order of 50 volts. The triggering threshold ve3 of the voltage limiter e3 should therefore be lower than 50 volts, and the resistor R3 should be computed accordingly, according to the criteria already seen here above. The current-voltage characteristic of the device of FIG. 12 is shown in FIG. 13. S0 long as the voltage VE1-VN0 is between 0 volts and the triggering voltage ve3 of the voltage limiter e3, there is no current drawn at the contact pad E1. The current-voltage characteristic has a zero slope. Beyond the voltage Ve3, the voltage limiter e3 gets triggered. The current-voltage characteristic has a slope equal to 1/R3.

The foregoing examples have provided some instances of practical cases implementing the various innovative principles, particularly that of obtaining a large protection characteristic for each of the contact pads of the integrated circuit with respect to the substrate which forms a common internal node for these contact pads, the substrate being isolated from the external reference voltage to which it is usually short-circuited. These practical examples are not restrictive and are only examples of application of the principle of the invention which could be combined with one another. For example, for the output of a CMOS inverter, the examples seen in FIGS. 8 and 10 will be used.

The invention makes it possible advantageously to resolve the problem of polarity reversal and that of the positive and negative overvoltages of the order of one hundred volts applied almost permanently (several seconds or minutes).

The structure of the invention also offers efficient protection against latch-up (the triggering of parasitic thyristors of the integrated circuit by excessive values of drawn current, which may lead to the destruction of the integrated circuit). Indeed, the structure proposed makes it possible to eliminate the causes and the effects of the triggering of the thyristors: using the protection devices according to the invention, the current drawn on any contact pad whatsoever is always below a limit current I0 of the order of 10 milliamperes for a voltage of less than about a hundred volts. This current limitation is strong enough to prevent the triggering of a thyristor.

In the prior art, there always existed a forward biased diode between a contact pad and an internal reference voltage, capable of letting through a strong current: a latch-up was then always possible.

The disclosed current limiting resistors R0, R1 etc. advantageously eliminate triggering of the thyristors, since the current on the contact pads of the voltages V1 and V2 is always limited. There is therefore no longer any short-circuit possible between V1 and V2 as in the prior art. Generally speaking, the structure of an integrated circuit modified according to the invention enables the circuit to be protected against high currents which may be deliberately forced onto the contact pads of the integrated circuit for fraudulent purposes, for example to falsify the working of a memory. These problems of fraud relate especially to bank cards. The isolation of the substrate and the protection devices, placed between each of the contact pads and this isolated substrate, enable such activities to be completely prevented.

However, the above-described protection devices cannot be used to protect the integrated circuit against overvoltages that are very high but very brief, for example against electrostatic discharges (typically of 2 kilovolts for 1 microsecond). They can be used only for protection against "permanent", long-duration overvoltages.

A protection device 201 to 205 against electrostatic discharges is therefore added between each of the contact pads and the substrate node N0, upline from the associated protection device (FIG. 1). Such a device 205 is shown in FIG. 12. It is placed between the contact pad E1 and the substrate, upline from the limitation resistor R3 and the voltage limiter e3 of the associated protection device 105 against the overvoltages.

In an example shown in FIG. 12, the protection device against electrostatic discharges is an NPN type lateral bipolar transistor for a P− type substrate, having its collector cb connected to the contact pad E1 and its emitter eb and base bb connected to the substrate node N0.

In the invention, there is proposed a particular embodiment of this lateral bipolar transistor so that it gets triggered for a threshold of the order of 100 volts. Thus, it does not hamper the working of the device for protection against permanent overloads and, on the contrary, takes over its role efficiently from 100 volts onwards for protection against electrostatic discharges. This particular embodiment is shown in FIG. 13. The emitter eb of the transistor is an N+ diffusion 16 connected to the node N0 of the substrate. The collector cb of the transistor connected to the contact pad E1 is an N+ diffusion 15 buried integrally in an N− well 14. The emitter and the collector are facing each other and the P− substrate band between the well 14 and the emitter eb forms the base bb of this transistor.

For a negative voltage VE1-VN0, the N/P well/substrate diode goes into forward bias starting from −0.6 volts. For a positive voltage VE1-VE0, the N/P− well/substrate diode goes into avalanche break-down towards 100 volts: the conduction is then achieved by collector-base breakdown voltage (BVcb) followed by a collector-emitter breakdown voltage (BVce): the current-voltage characteristic typical of this lateral bipolar transistor is shown in FIG. 15.

The particular embodiment shown in FIG. 13 consists in the making of the diffusion connected to the lug to be shielded entirely in a well and not partially in a well or directly in the substrate, thus making it possible to obtain breakdown voltages of the order of 100 volts.

With the protection device against electrostatic discharges added as a complement to the integrated circuit structure proposed in the invention, a general protection of the integrated circuit is obtained against all the possible external destructive phenomena. In the case of the protection of the contact pad V2 (FIG. 2), the lateral bipolar transistor is made by adding an N+ diffusion 17 connected to the substrate node N0 between the substrate contact ps and the N− well 11: the lateral bipolar transistor which is thus formed in the very structure of the diode and is in parallel on the diode D2 shields the latter from the electrostatic discharges.

In practice, there could be a single general protection device for several pads of the same type (having the same constraints), for example the inputs at the CMOS inverter gates, with a single protection device against electrostatic overloads and a single protection device against overvoltages.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for manufacture of an integrated circuit biased by a first external bias voltage and a second external bias voltage and including a plurality of external signal pads for communicating signals with the integrated circuit, comprising:

forming in a semiconductor substrate with a first type of doping, a diffusion of a second type of doping, such that when said substrate is biased by an internal reference voltage said substrate and said diffusion form a forward biased diode when in a state of normal bias of said integrated circuit and form a reverse biased diode when in a state of reverse bias of said integrated circuit; and forming for each external signal pad a protection device in the semiconductor substrate connected between the external signal pad and the substrate.

2. The method of claim 1, wherein: the integrated circuit includes a first external reference voltage pad for providing the first external bias voltage to the integrated circuit and a second external reference voltage pad for providing the second external bias voltage to the integrated circuit such that the voltage level of the second external bias voltage is normally less than the voltage level of the first external bias voltage; and further comprising:

connecting the diffusion to the second external reference voltage pad.

3. The method of claim 1, wherein:

forming the protection device comprises forming for each external signal pad a voltage limiting device connected between the external signal pad and the substrate.

4. The method of claim 3, further comprising:

forming at each external signal pad a current limiting resistor connected between the external signal pad and the corresponding voltage limiting device.

5. The method of claim 1, wherein:

forming the protection device comprises forming for each external signal pad an electrostatic protection device connected between the external signal pad and the substrate.

6. A method of manufacturing an integrated circuit having a substrate of semiconductor material of a first conductivity type, comprising the steps of:

forming a first diode in the substrate having an anode and a cathode;

forming a second diode in the substrate having an anode of the first conductivity type forming part of the substrate and a cathode of a second conductivity type;

forming a first external supply pad;

forming a second external supply pad having a terminal connected to the cathode of the second diode so as to isolate the substrate from the second external supply pad;

forming a first internal reference line connected to the cathode of the first diode, for supplying a first reference voltage; and forming a second internal reference line connected to the anode of the first diode and the anode of the second diode, for supplying a second reference voltage at both the anode of the first diode and the anode of the second diode which is less than the first reference voltage.

7. The method of claim 6, further including the step of:

forming a resistor element in the substrate having a first terminal connected to the first internal reference line and a second terminal connected to the second internal reference line.

8. The method of claim 7, further including the steps of:

forming a plurality of signal pads for communicating electrical signals to the integrated circuit; and for each signal pad, forming an electrostatic protection device connected between the signal pad and the substrate.

9. The method of claim 6, further comprising the step of:

forming a voltage limiting element between the first internal reference line and the second internal reference line.

10. The method of claim 9, wherein the step of forming a voltage limiting element comprises the steps of:

forming a first zenor diode in the substrate having an anode and a cathode connected to the first internal reference line; and forming a second zenor diode in the substrate having an anode connected to the second internal reference line and a cathode connected to the anode of the first zenor diode.

11. The method of claim 10, wherein the step of forming a voltage limiting element further comprises the step of:

forming a resistor element in the substrate having a first terminal connected to the first internal reference line and a second terminal connected to the first external supply pad.

12. The method of claim 6, further comprising the step of:

forming an electrostatic discharge device connected to the second diode.

13. The method of claim 12, wherein the step of forming an electrostatic discharge device comprises the steps of:

forming an emitter diffusion region of the second conductivity type in the substrate;

connecting the emitter diffusion region to the second internal reference line;

forming a collector diffusion region of the second conductivity type in the substrate, the collector diffusion region, the emitter diffusion region and the substrate region between the collector diffusion region and the emitter diffusion region forming the collector, emitter and base regions, respectively, of a bipolar transistor; and connecting the collector diffusion region to the second external supply pad.

14. The method of claim 6, further comprising the steps of:

forming a transistor of the first conductivity type in the substrate having a source region and a drain region and being sized to drive an off-chip signal;
forming an external output pad;
forming a current limiting resistor in the substrate having a first terminal and a second terminal;
connecting the first terminal of the current limiting resistor to the drain region of the transistor and the second terminal of the current limiting resistor to the external output pad; and
forming a voltage limiting element connected between the substrate and the source region of the transistor.

15. The method of claim 6, further comprising the steps of:
forming a plurality of transistors of the first conductivity type in the substrate, each transistor having a source region and a drain region and being sized to drive an off-chip signal;
forming a plurality of external output pads;
forming a plurality of current limiting resistors in the substrate, each having a first terminal and a second terminal;
connecting the first terminal of a current limiting resistor to the drain region of a distinct transistor and the second terminal of the current limiting resistor to a distinct external output pad; and
forming a plurality of voltage limiting elements, each connected between the substrate and the source region of a distinct transistor.

16. The method of claim 6, further comprising the steps of:
forming a transistor of the second first conductivity type in the substrate having a source region connected thereto and a drain region and being sized to drive an off-chip signal;
forming an external output pad;
forming a current limiting resistor in the substrate having a first terminal and a second terminal;
connecting the first terminal of the current limiting resistor to the drain region of the transistor and the second terminal of the current limiting resistor to the external output pad; and
forming a voltage limiting element connected between the substrate and the drain region of the transistor.

17. The method of claim 6, further comprising the steps of:
forming a plurality of transistors of the second conductivity type in the substrate, each transistor having a source region connected to the substrate and a drain region and being sized to drive an off-chip signal;
forming a plurality of external output pads;
forming a plurality of current limiting resistors in the substrate, each having a first terminal and a second terminal;
connecting the first terminal of a current limiting resistor to the drain region of a distinct transistor and the second terminal of the current limiting resistor to a distinct external output pad; and
forming a plurality of voltage limiting elements, each connected between the substrate and the drain region of a distinct transistor.

18. The method of claim 6, further comprising the steps of:
forming a pull-up device of the first conductivity type having a source region, a drain region and a gate electrode;
forming a pull-down device of a second conductivity type having a source region, a drain region and a gate electrode;
forming an external input pad;
forming a current limiting resistor connected in series between the external input pad and the gate electrode of the pull-up device and the pull-down device; and
forming a voltage limiting device shunted between the substrate and the gate electrode of the pull-up device and the pull-down device.

19. A method of fabricating an integrated circuit having a semiconductor substrate, comprising the steps of:
forming a diode in the semiconductor substrate having an anode connected to the semiconductor substrate and a cathode;
forming an external voltage supply contact pad connected to the cathode of the diode, for receiving an external reference voltage and providing an internal reference voltage from the anode of the diode to circuitry of the integrated circuit;
forming a plurality of external signal contact pads which are coupled to the circuitry of the integrated circuit; and
forming a plurality of protective devices in the substrate, each protective device being connected between an external signal contact pad and the substrate such that each external signal contact pad is connected to a protective device, for protecting the circuitry of the integrated circuit against excessive electrical conditions appearing on the external signal contact pads relative to the substrate.

20. The method of claim 19, further including the steps of:
forming a first reference voltage line on the substrate for distributing a first reference supply voltage within the integrated circuit;
forming a second reference voltage line on the substrate for distributing a second reference voltage within the integrated circuit; and
connecting the substrate to the second reference voltage line.

21. The method of claim 20, further including the step of:
forming a biasing element in the semiconductor substrate connected between the first reference voltage line and the substrate.

22. The method of claim 19, wherein the step of forming a plurality of protection devices comprises the steps of:
forming a plurality of overvoltage protection devices in the semiconductor substrate; and
connecting each overvoltage protection device between an external signal contact pad and the substrate.

23. The method of claim 22, wherein the step of forming a plurality of overvoltage protection devices comprises the step of:
for each overvoltage protection device, forming a voltage limiting device in the substrate connected between the corresponding external signal contact pad and the substrate.

24. The method of claim 23, wherein the step of forming a plurality of overvoltage protection devices comprises the step of:
for each overvoltage protection device, forming a resistive element in the substrate connected between the corresponding external signal contact pad and the voltage limiting device.

25. The method of claim 19, wherein the step of forming a plurality of protection devices comprises the steps of:

forming a plurality of electrostatic discharge protection devices in the semiconductor substrate; and connecting each electrostatic discharge device between an external signal contact pad and the substrate.

26. The method of claim 25, wherein the step of forming a plurality of electrostatic discharge protection devices comprises the step of:

for each electrostatic discharge protection device, forming a lateral bipolar transistor in the substrate having collector, base and emitter regions such that the base and emitter regions are connected together.

27. A method of protecting an integrated circuit from excessive electrical conditions, the integrated circuit being formed from a semiconductor substrate and including a plurality of contact pads, including first and second contact pads for providing external reference voltages to the integrated circuit, first and second internal reference voltage lines, and a plurality of active devices formed in the semiconductor substrate, the method comprising the steps of:

isolating the semiconductor substrate from the second contact pad;

connecting the semiconductor substrate to the second internal reference voltage line; and for each contact pad, shunting current flowing into the contact pad to the substrate upon a voltage appearing between the contact pad and the substrate exceeding a first voltage level.

28. The method of claim 27, wherein:

the step of isolating includes the step of biasing the substrate relative to the second contact pad.

29. The method of claim 27, wherein:

the first predetermined voltage level corresponds to a diode breakdown voltage level.

30. The method of claim 27, further including the step of:

for each contact pad, limiting current levels flowing therein during the step of shunting.

31. The method of claim 27, wherein:

the step of shunting current occurs upon a positive voltage level appearing on the contact pad relative to the substrate exceeding the first predetermined voltage level.

32. The method of claim 27, further including the steps of:

for each contact pad, shunting current flowing through the contact pad caused by electrostatic discharge upon the voltage appearing between the contact pad and the substrate exceeding a second predetermined voltage level, the second predetermined voltage level being greater than the first predetermined voltage level.

33. The method of claim 27, further including the step of:

for each contact pad, limiting current flow between the first and second external pads upon a voltage level appearing on the first external pad being less than a voltage level appearing on the second external pad.

34. The method of claim 33, wherein:

the step of limiting current flow between the first and second external pads comprises the step of creating a substantially open circuit between the first external pad and the second external pad.

* * * * *